(12) United States Patent
Wilson et al.

(10) Patent No.: US 8,760,225 B1
(45) Date of Patent: Jun. 24, 2014

(54) BICMOS GATE DRIVER FOR CLASS-S RADIO FREQUENCY POWER AMPLIFIER

(71) Applicant: LSI Corporation, San Jose, CA (US)

(72) Inventors: Ross S. Wilson, Menlo Park, CA (US); Said E. Abdelli, Minneapolis, MN (US); Peter Kiss, Basking Ridge, NJ (US); Donald R. Laturell, Oak Hill, FL (US); Kameran Azadet, Pasadena, CA (US); James F. MacDonald, Stillwater, MN (US)

(73) Assignee: LSI Corporation, San Jose, CA (US)

( * ) Notice: Subject to any disclaimer, the term of this patent is extended or adjusted under 35 U.S.C. 154(b) by 16 days.

(21) Appl. No.: 13/736,442

(22) Filed: Jan. 8, 2013

(51) Int. Cl.
*H03F 3/38* (2006.01)

(52) U.S. Cl.
USPC .......................... 330/10; 330/251; 330/207 A

(58) Field of Classification Search
USPC ........................................ 330/10, 251, 207 A
See application file for complete search history.

(56) References Cited

U.S. PATENT DOCUMENTS

| 5,166,635 | A | | 11/1992 | Shih |
|---|---|---|---|---|
| 6,072,361 | A | * | 6/2000 | Myers et al. .................... 330/10 |
| 6,954,623 | B2 | | 10/2005 | Chang et al. |
| 7,394,311 | B2 | * | 7/2008 | Jeckeln et al. ................. 330/10 |
| 7,558,334 | B2 | * | 7/2009 | McCune et al. .............. 375/297 |
| 7,898,060 | B2 | | 3/2011 | Williams et al. |
| 7,940,125 | B2 | | 5/2011 | Wang |
| 7,953,174 | B2 | * | 5/2011 | Asbeck et al. ................ 375/295 |

* cited by examiner

*Primary Examiner* — Hieu Nguyen
(74) *Attorney, Agent, or Firm* — Suiter Swantz pc llo

(57) ABSTRACT

The invention may be embodied in a resynchronizing, push-pull drive circuit for driving the gate electrodes of a digital Class-S Radio Frequency Power Amplifier (RF-PA). A binary bitstream received from a bitstream generator, such as a sigma-delta modulator, Viterbi-based optimal-bit-pattern modulator sigma-delta, or other suitable modulator, is resynchronized to a low-jitter master clock, then converted to fast-rise, high-swing complementary digital signals to drive the gates of the Class-S RF-PA. The drive circuit provides a high slew-rate, large-swing, quasi-digital gate drive circuit to drive the significant gate capacitance of the RF-PA with sufficient rise times. A combination of bipolar transistor current switches and cascoded CMOS devices is employed to attain requisite performance. For example, the driving circuit is well suited for use with Class-S RF-PAs used in wireless communication systems.

21 Claims, 5 Drawing Sheets

BICMOS GATE DRIVER FOR CLASS-S RADIO FREQUENCY POWER AMPLIFIER

TECHNICAL FIELD

The present invention relates to switched radio frequency amplifiers (Class-S RF-PAs) suitable for use in wireless communications and, more particularly, to a circuit employing a combination of bipolar transistor current switches and cascoded CMOS transistors driving the gate electrodes of a digital Class-S RF-PA.

BACKGROUND

Digital Class-S Radio Frequency Power Amplifier (RF-PAs) employ a spectrally shaped bitstream to switch the output stages in binary fashion. In operation, a bitstream generator, such as a sigma-delta modulator or Viterbi-based optimal-bit-pattern modulator, encodes an input baseband signal into a digital pulse stream in which the information-bearing baseband signal is frequency-translated to a desired carrier frequency. Simultaneously, the encoding process shapes quantization noise, assuring that it is greatly attenuated in the vicinity of the carrier frequency and pushed out-of-band, where quantization noise can be removed by bandpass filtering.

The bitstream drives the gates of a push-pull switch-mode final stage, through a level shift gate driver. The output of the final stage passes through a bandpass filter (BPF) to recover the modulated RF signal and to eliminate the out-band quantization noise.

Gate driving of the Class-S RF-PA is not amenable to conventional medium/narrow bandwidth RF matching techniques, as efficient final stage switching requires fast gate voltage rise times on the order of less than 50% of the bitstream generator's clock period and hence essentially a pulse drive capable of driving the input (gate) capacitance of the Class S amplifier's output stage.

One approach to gate-driving employs a current-steering long-tailed pair having low-valued collector/drain loads coupled directly to the gates of the driven transistors, but suffers problem of high power dissipation. Yet another approach to gate driving employs complementary class-AB type emitter followers in a totem-pole arrangement. This architecture is subject to the well-known instabilities exhibited by emitter followers when driving capacitive loads. Alternatively, high-speed CMOS output buffers may be employed, but are subject to breakdown limitations characteristic of thin-oxide narrow-gate length transistors.

There is, therefore, a continuing need for improved electronic circuits for driving the electrodes of Class-S RF-PAs. More particularly, there is a need for gate driving circuits with sufficiently fast rise times for driving the significantly capacitive load of the gates of the input transistors of the RF-PA with improved power consumption and stability characteristics.

SUMMARY

The invention may be embodied in a resynchronizing, push-pull drive circuit for driving the gate electrodes of a digital Class-S Radio Frequency Power Amplifier (RF-PA). For example, the driving circuit is well suited for use with Class-S RF-PAs used in wireless communication systems.

In a particular embodiment, a binary bitstream received from a bitstream generator, such as a sigma-delta modulator, Viterbi-based optimal-bit-pattern modulator sigma-delta, or other suitable modulator, is resynchronized to a low-jitter master clock, then converted to fast-rise, high-swing complementary digital signals to drive the gates of the Class-S RF-PA. The drive circuit provides a high slew-rate, large-swing, quasi-digital gate drive circuit to drive the significant gate capacitance of the RF-PA with sufficient rise times. A combination of bipolar transistor current switches and cascoded CMOS devices is employed to attain the requisite performance.

In particular, the drive circuit may employ cascoded CMOS complementary gate drivers and a symmetrical driver stage to overcome deficiencies of the prior art gate driver designs and yield a stable, fast rise output capable of high-capacitance drive. The invention also teaches a method of buffering a low-level digital data signal to produce complementary gate-drive levels. Further, means are proposed to introduce Vernier relative skew shifts between nominally complementary outputs, to compensate for asymmetries in monolithic microwave integrated circuit (MMIC) layout and/or differential parametric shifts in the RF-PA output devices. For example, the drive circuit may provided with a Vernier control adjustable through a control register on the drive circuit chip to precisely match signal path delays through the Class-S output stage.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE FIGURES

The numerous advantages of the invention may be better understood with reference to the accompanying figures in which.

DETAILED DESCRIPTION OF ILLUSTRATIVE EMBODIMENTS

Figure 1:
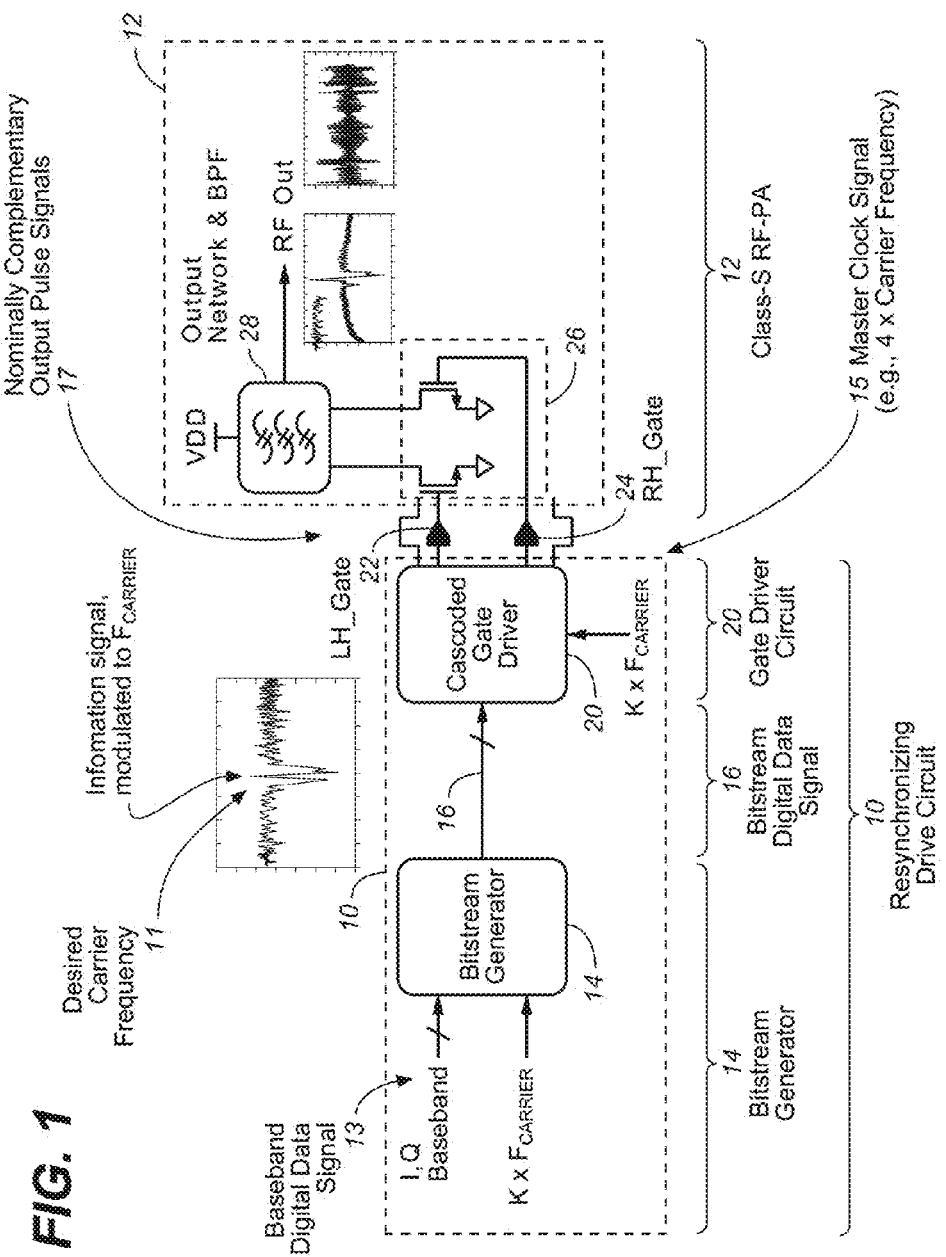
FIG. 1 is a schematic diagram of a resynchronizing, push-pull drive circuit driving the electrodes of a Class-S RF-PA.

The invention may be embodied as a resynchronizing, push-pull drive circuit for driving the gate electrodes of a digital Class-S Radio Frequency Power Amplifier (RF-PA). FIG. 1 is a schematic diagram of an illustrative resynchronizing drive circuit 10 driving the output electrodes of a Class-S RF-PA 12. While FIG. 1 illustrates a typical Class-S RF-PA system in which the invention may be practiced, the invention is not limited to this particular configuration.

In operation, a bitstream generator 14, such as a sigma-delta modulator, Viterbi-based optimal-bit-pattern modulator sigma-delta, or other suitable modulator, encodes an information-bearing baseband digital data signal 13 into a bitstream digital data signal 16 in which the digital data signal is frequency-translated to a desired carrier frequency. The bitstream generator is typically clocked at a multiple of the carrier frequency (K×Fcarrier), such as four times the carrier frequency. Concurrently, the encoding process shapes quantization noise, assuring that it is greatly attenuated in the vicinity of the carrier frequency 11. As will be described further with reference to FIG. 2, a resynchronizing drive circuit 10 retimes the digital data signal 16 by clocking the digital data signal with a master clock signal 15 matching the bitstream generator clock rate, such as four times the desired carrier frequency. The master clock signal 15 is preferably generated by a low-jitter master clock oscillator 31 to generate nominally complementary output pulse signals 17 at the output terminals 22, 24 of the resynchronizing drive circuit 10, which are connected to the gate electrodes of the output transistors 26 of the Class-S RF-PA 12.

While prior Class-S gate driver circuits have typically employed GaN HEMT devices, which are not monolithically integrable, the present invention utilizes cascoded CMOS gate drivers 36a-b in a push-pull configuration to create the nominally complementary output pulse signals 17 to drive the gates of the output transistors 26 of the Class-S RF-PA 12. Within the Class-S RF-PA 12, the signal from the output transistors 26 is passed through a bandpass filter (BPF) 28 to recover the modulated RF signal containing the digital data signal 13 encoded in the output signals from the transistors 26 and eliminate out-band quantization noise.

Because a wide passband is necessary to secure fast gate voltage rise times necessary for efficient switching of the Class-S output transistors 26, standard narrowband RF matching techniques cannot be effectively employed in the gate-drive path. Instead, a high slew-rate, large-swing quasi-digital gate drive circuit 20 is required having capability to drive the significant gate capacitance of the Class-S output transistors 26. For example, in a Class-S RF-PA emitting in the 2 GHz band, the fundamental output period of a bandpass bitstream may be 1/(4×2 GHz)=125 ps; and gate voltage rise times of approximately 40 ps are required with 2.4V swings driving 15 pF gate capacitance.

It may be possible to realize a gate driver having requisite performance through a current-switching long-tailed pair of transistors the collectors of which are directly connected to the terminals 22 and 24. In this case, however, the load resistance RL must be chosen, for example, as 40 ps/15 pF=30. To achieve a 2.4 V swing, the tail current must be approximately 800 mA, thus causing considerable power consumption.

Yet another approach to gate driving employs complementary class-AB type emitter followers in a totem-pole arrangement. This architecture is subject to the well-known instabilities exhibited by emitter followers when driving capacitive loads.

Conventionally, high-speed CMOS output buffers may be employed, but are subject to breakdown limitations characteristic of thin-oxide narrow-gate length transistors. The present invention overcomes these limitation of the prior art gate driver circuits through the use of the resynchronizing drive circuit 10 utilizing the cascoded CMOS gate drivers 36a-b connected in a push-pull configuration to produce the nominally complementary output pulse signals 17 for driving the gates of the output transistors 26 of the Class-S RF-PA 12.

Figure 2:
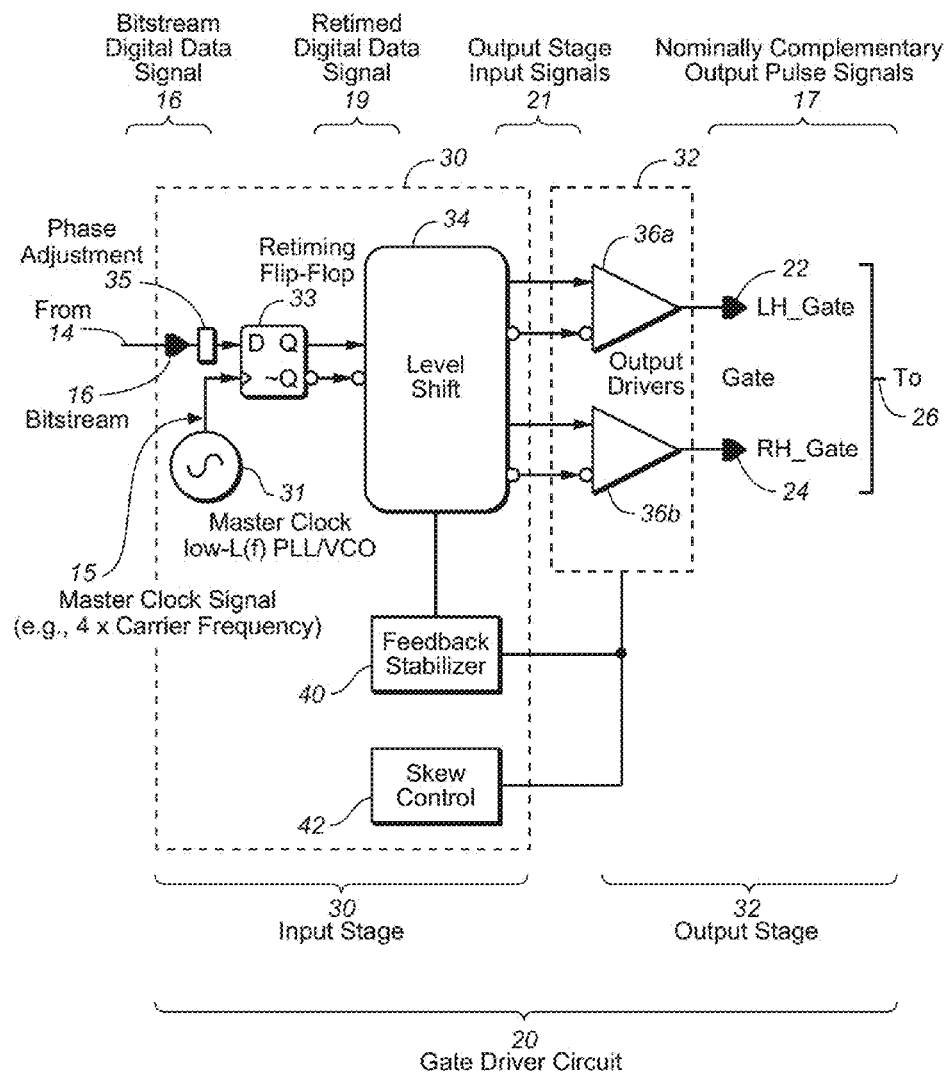
FIG. 2 is a schematic diagram of the gate drive circuit of the resynchronizing, push-pull drive circuit.

FIG. 2 is a schematic diagram of the gate driver circuit 20, which employs an input stage 30 that resynchronizes and boosts the voltage of the bitstream data signal 16 received from the bitstream generator 14. The input stage 30 includes a low-jitter master clock oscillator 31 for generating a master clock signal 15 operating at a harmonic of the desired carrier frequency, such as four times the desired carrier frequency, for resynchronizing the input digital data signal 13 at the desired carrier frequency 11.

The gate driver circuit 20 further includes an output stage 32 that generates the nominally complementary high level output pulse signals 17 supplied to the gate electrodes of the output transistors 26 of the Class-S RF-PA 12. The output stage 32 includes the cascoded CMOS gate drivers 36a-b connected in a push-pull configuration to generate the nominally complementary output pulse signals 17. Although a two-level push-pull cascode stack 36a-b is illustrated, the concept can be extended to additional cascoded levels (i.e., cascaded levels) by modulating the gate potentials of the upper devices in the stack to coordinate the firing of the CMOS levels to deliver the combined voltages of the stack levels to the gate electrodes of the output transistors 26 in a push-pull manner.

Resynchronization of the digital data signal 16 with the master clock signal 15 generated by the low phase noise master clock oscillator 31 eliminates asymmetries arising from signal transmission over backplane conductors from the bitstream generator 14, which due to high logic complexity, is preferably realized on a silicon chip using in fine-line CMOS technology. Further, resynchronization allows use in bitstream generator of a clocking PLL having poorer phase noise characteristics than required for the emitted RF signal. The necessary wide-bandwidth pulse-mode connection between the output gates 22, 24 of the drive circuit 20 and the gates of the output transistors 26 of the Class-S RF-PA necessitates their mounting in close proximity, preferably as a hybrid or MMIC circuit.

The bitstream digital data signal 16 is delivered to the input stage 30 of the gate driver circuit 20 from the sigma-delta modulator or other means represented by the bitstream generator 14 shown in FIG. 1. The digital data signal 16 may be delivered in differential (preferred), single-ended format, or any other suitable format that the input stage 30 is configured to receive. Within the input stage 30, the digital data signal 16 is resynchronized upon receipt by the low phase noise (low-jitter) master clock oscillator 31 through a retiming flip-flop 33. The retiming flip-flop 33 is preferably preceded by a phase adjustment circuit 35 which centers the eye of the incoming bitstream 16 upon the retiming clock delivered by low phase noise oscillator 31. Phase adjustment accounts for time skew between the bitstream generator clock and the low phase noise master clock 31. These clocks are of exactly the same frequency, but may have arbitrary phase offset due to tolerances in interconnect length; transceiver delays, and phase shift in the on-chip PLL which clocks bitstream generator 14. To assure frequency coherence and stable phase offset between bistream generator clock 14 and master clock oscillator 31, a sample of master clock oscillator is preferably furnished to the bitstream generator as a clock PLL reference signal.

The resulting output from the flip-flip 33 is then boosted by the level shift 34 to produce the output stage input signals 21 characterized by voltages suitable to drive the cascoded output stage gate drivers 36a-b to produce the nominally complementary output pulse signals 17 at the output gates 22, 24 of the drive circuit 20. The nominally complementary output pulse signals 17 are optionally skew shifted (e.g., Vernier shifted) by the skew shift control block 42 to counteract distortions inherent the nominally complementary output pulse signals 17 and/or the Class-S RF-PA 12, such as signal path delay differences through the Class-S output stage. A feedback stabilizer 40 provides signals representative of the nominally complementary output pulse signals 17 back to the level shift 34 to provide feedback stabilization of the output pulse signals. The resulting output pulse signals 17 are then used to drive the gate terminals of the output transistors 26 of the Class-S RF-PA.

Figure 3A:
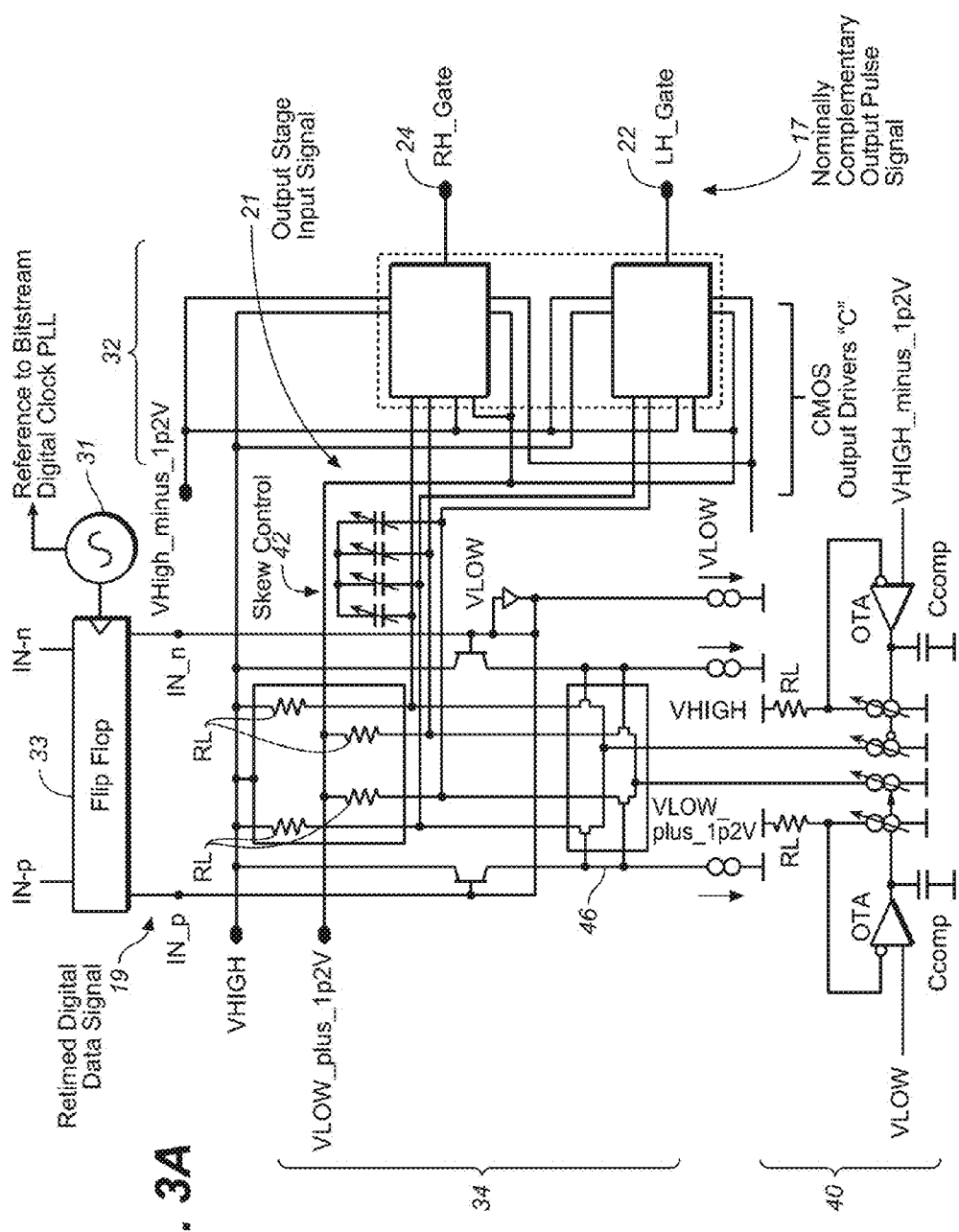
FIGS. 3A and 3B are schematic diagrams showing additional details of the gate drive circuit of the resynchronizing, push-pull drive circuit.
Figure 3B:
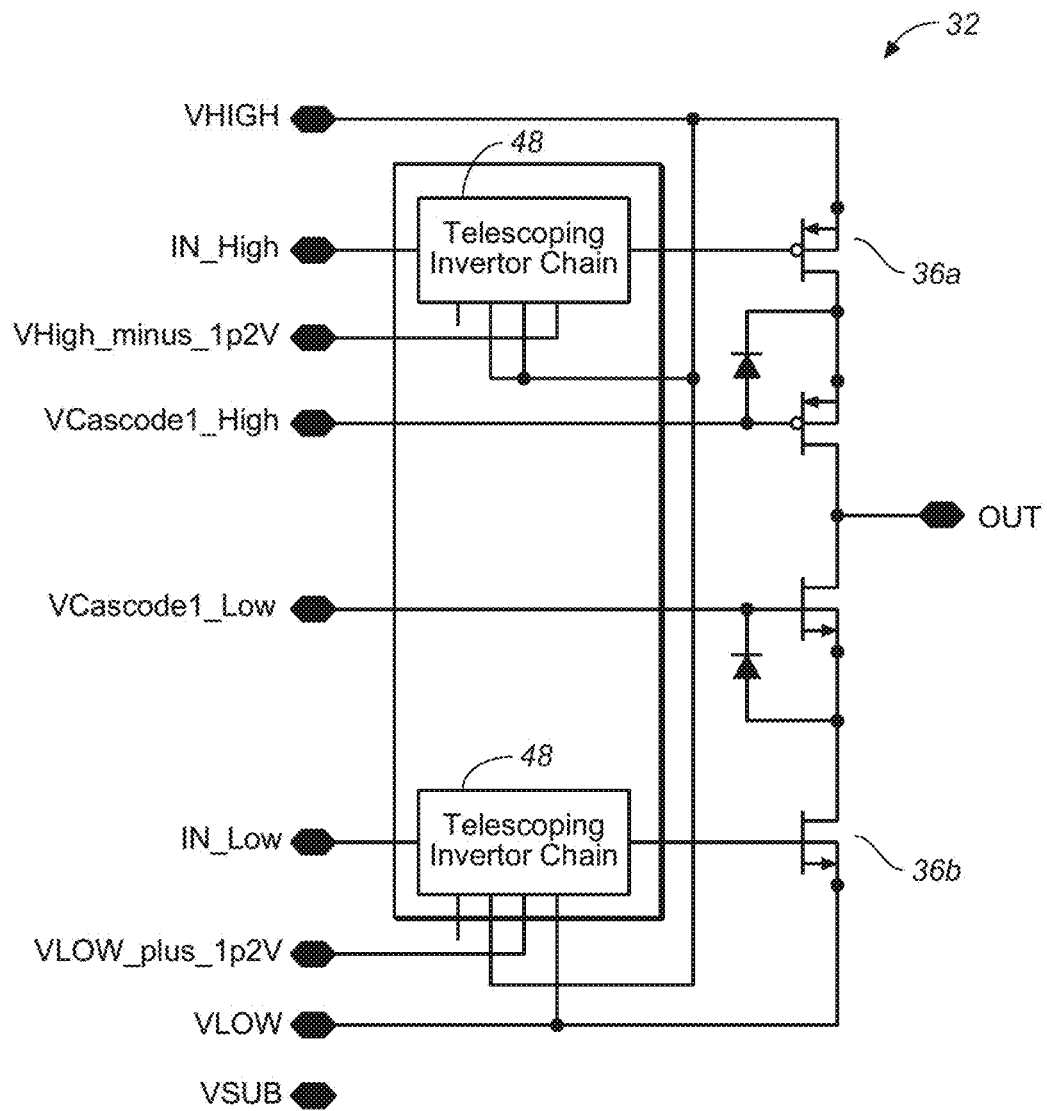

FIGS. 3A and 3B are schematic diagrams showing additional details of the level shift 34 and output gate drivers 32 shown in FIG. 2. In this particular configuration, which is merely illustrative of one possible implementation of the invention, pins IN_p and IN_n of the retiming flip-flop 33 receive the phase adjusted bitstream signal from the phase adjuster 35 and the retiming master clock signal 15 from the master oscillator 31. The retimed bitstream signal 19 from the flip-flop 33 is buffered in an emitter follower buffer and applied to a long tailed pair of cascoded current switching transistors 46. The output from the current switching transistors constitutes the nominally complementary output stage input signals 21 supplied to the inputs of the output gate drivers 36a-b. The collector nodes of the cascoded transistor pair of the current switching transistors are returned to two different supply rail potentials: VHIGH (Ground) and VLOW plus 1.2V. This causes the gate driver outputs 22, 24 (RH_Gate and LH_Gate) of the cascoded gate drivers 36a-b to swing between Ground and VLOW, which for a 130 nm CMOS process, is set to approximately 2×VDD in the range of 2.4 to 3 Volts. By this supply disposition, the inputs to the output stage CMOS gate drivers 36a-b are constrained to VDD-amplitude swings.

The skew control block 42 may be configured to counteract distortions inherent the nominally complementary output pulse signals 17 and/or the Class-S RF-PA 12, such as signal path delays through the Class-S output stage. More specifically, the skew control block 42 may configured to introduce Vernier relative skew shifts between the nominally complementary outputs 17. That is, the output pulse signals 17 may be nominally complementary in that they may reflect strictly complementary pulse trains that are subsequently Vernier skew shifted to achieve certain design objectives. For example, the skew control circuit 42 may include skew control capacitors to allow skew adjustments of the relative timing of the LH_Gate and RH_Gate signals to compensate for asymmetries in monolithic microwave integrated circuit (MMIC) layout and/or differential parametric shifts in the RF-PA output devices, such as signal path delays through the Class-S output stage. Preferably, the skew control capacitors are programmatically variable from a control register contained on a chip embodying the gate driver circuit 20.

The additional feedback stabilizer 40 may be configured to stabilize the voltage swings produced by the level shift 34 reflected in the output stage input signals 21 to produce the required CMOS input level swings at the inputs to the gate drivers 36a-b. In particular, the feedback stabilizer 40 may regulate the output stage input signals 21 to contract signal drift and ensure a precise supply of the desired voltage swings at the inputs to the gate drivers 36a-b. For example, simple operational transconductance amplifiers (OTAs) may be employed to implement GmC feedback loops to regulate the swings of the current switching transistors precisely to the VDD voltage of the selected CMOS process, typically 1.2V for 130 micron devices. This causes the inputs of gate drivers 36a-b to be pulled to their respective rail voltages, while undergoing voltage swings of approximately 1.2V, irrespective of the absolute value of the load resistors.

FIG. 3B shows the circuit diagram of the CMOS Output Drivers 32. Telescoped buffer chains 48 amplify and power-up the inputs received from Level Shift 34; and apply the result to the lower transistors of two cascoded pairs 36a-b whose outputs are tied together to produce the LH_Gate and RH_Gate signals which drive the Class S output transistors. Due to cascoding, and to provision of independent drive to the PMOS and NMOS cascode chains, a 2×VDD swing at the outputs is achieved.

Figure 4:
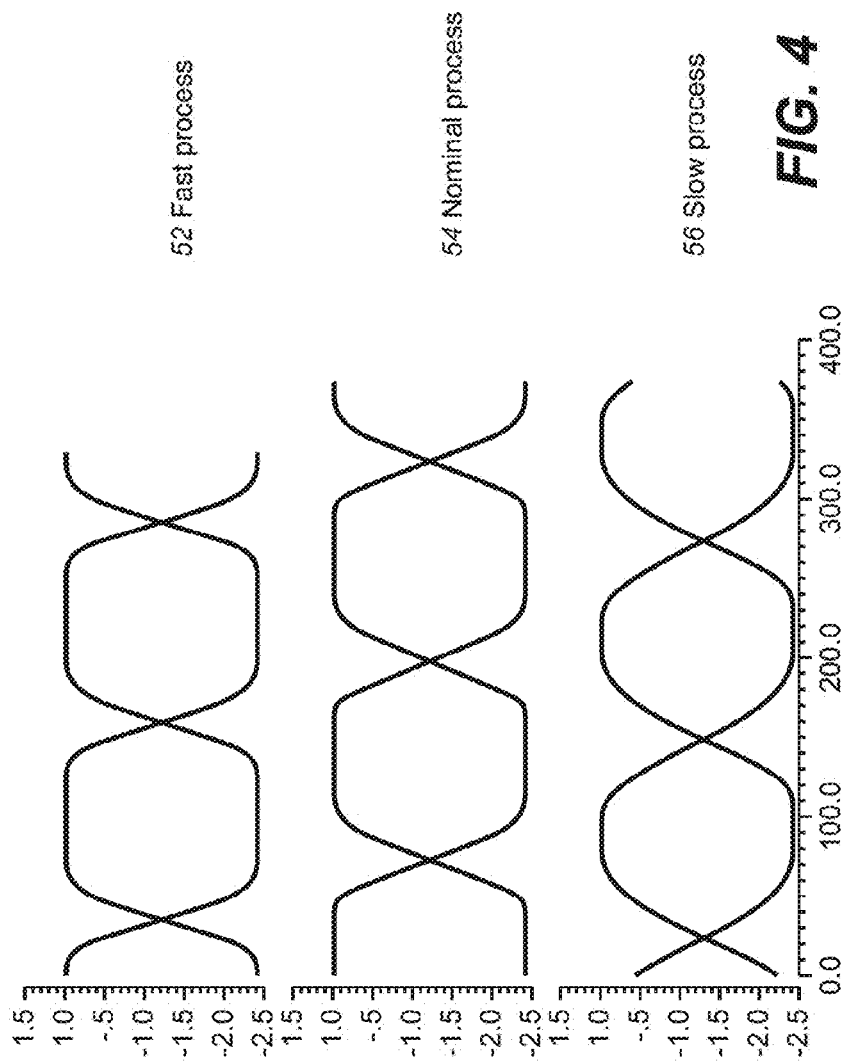
FIG. 4 is a set of graphs illustrating the rise time performance of the resynchronizing, push-pull drive block.

FIG. 4 is a set of graphs 50 illustrating the performance achieved by one particular example of the gate driver topology of the present invention. This example is based on use of a SiGe BiCMOS process having Lg(min)=130 nm and npn Ft—50 GHz, a load capacitance of 20 pF, and transition rate of 8 GTra ns/s. Graph 52 illustrates a fast switching process, graph 54 illustrates a nominal switching process, and graph 56 illustrates a slow switching process in this particular example circuit.

The present invention may consist (but not required to consist) of adapting or reconfiguring presently existing systems. Alternatively, original equipment may be provided embodying the invention.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

The invention claimed is:

1. A gate driver circuit [20] for driving gates of output transistors [26] of a switching radio frequency power amplifier [12], comprising:
    an input stage [30] operative for receiving a bitstream digital data signal [16] comprising a baseband digital data signal [13] frequency-translated to a desired carrier frequency [11] and converting the bitstream digital data signal [16] into a pair of output stage input signals [21] encoding the digital data signal [13];
    an output stage [32] operative for receiving the output stage input signals [21] and generating nominally complementary output pulse signals [17] at a pair of output gates [22, 24] encoding the digital data signal [13]; and
    wherein the output stage [32] comprises a pair of cascoded CMOS gate drivers [36a-b] connected in a push-pull configuration.

2. The gate driver circuit of claim 1, further comprising a skew controller [46] operative for introducing relative skew shifts between the nominally complementary output pulse signals [17].

3. The gate driver circuit of claim 2, wherein the skew controller [46] is further operative to compensate for one or more of asymmetries in a monolithic microwave integrated circuit (MMIC) layout, differential parametric shifts in the switching radio frequency power amplifier [12].

4. The gate driver circuit of claim 1, wherein the input stage [30] further comprises:
    a low-jitter master clock oscillator [31] operative for generating a master clock signal [15] at a harmonic of the desired carrier frequency [11];
    a retiming flip-flop [33] operative for receiving the master clock signal [15] from the master clock oscillator [31], receiving the bitstream digital data signal [16], and generating a retimed digital data signal [19] by modulating the bitstream digital data signal [16] with the master clock signal [15] to resynchronize the digital data signal [13] at the desired carrier frequency [11]; and
    a level shift [34] operative for receiving the retimed digital data signal [19], increasing a voltage characterizing the retimed digital data signal [19], and reflecting the increased-voltage, resynchronized digital data signal in the output stage input signals [21].

5. The gate driver circuit of claim 4, wherein the retiming flip-flop [33] is further configured to resynchronize the bitstream digital data signal [16] at the desired carrier frequency [11] using the master clock signal [15] to eliminate asymmetries arising from signal transmission over backplane conductors within a bitstream generator [14] utilized to frequency-translate the input baseband digital data signal [13] to the desired carrier frequency [11].

6. The gate driver circuit of claim 1, further comprising a feedback stabilizer [40] operative for stabilizing voltage swings in the output stage input signals [21].

7. The gate driver circuit of claim 6, wherein the feedback stabilizer [40] further comprises one or more feedback loops operative for regulating voltages in the output stage input signals [21] to produce consistent voltage swings irrespective of load resistor values.

8. The gate driver circuit of claim 1, further comprising a buffer [44] operative to supply desired power in the output stage input signals [21].

9. The gate driver circuit of claim 8, wherein the buffer [44] comprises one or more telescoped buffer chains.

10. A resynchronizing drive circuit [10] for driving gates of output transistors [26] of a switching radio frequency power amplifier [12], comprising:
    a bitstream generator [14] operative for encoding a baseband digital data signal [13] into an input baseband signal to generate an information-bearing input baseband signal and frequency-translating information-bearing input baseband signal to desired carrier frequency [11] to generate a bitstream digital data signal [16]; and
    a gate driver circuit [20] comprising:

an input stage [30] operative for converting the bitstream digital data signal [16] into a pair of output stage input signals [21] encoding the digital data signal [13], an output stage [32] operative for receiving the output stage input signals [21] and generating nominally complementary output pulse signals [17] at a pair of output gates [22, 24] encoding the digital data signal [13], and wherein the output stage [32] comprises a pair of cascoded CMOS gate drivers [36a-b] connected in a push-pull configuration.

11. The resynchronizing drive circuit of claim 10, wherein the output stage [32] further comprises a skew controller [42] operative for introducing relative skew shifts between the nominally complementary output pulse signals [17].

12. The resynchronizing drive circuit of claim 11, wherein the skew controller [42] is further operative to compensate for one or more of asymmetries in a monolithic microwave integrated circuit (MMIC) layout and differential parametric shifts in the switching radio frequency power amplifier [12].

13. The resynchronizing drive circuit of claim 10, wherein the input stage [30] further comprises:
a low-jitter master clock oscillator [31] operative for generating a master clock signal [15] at a harmonic of the desired carrier frequency [11];
a retiming flip-flop [33] operative for receiving the master signal [15] from the master clock oscillator [31], receiving the bitstream digital data signal [16], and generating a retimed digital data signal [19] by modulating the bitstream digital data signal [16] with the master clock signal [15] to resynchronize the digital data signal [13] at the desired carrier frequency [11]; and
a level shift [34] operative for receiving the retimed digital data signal [19], increasing a voltage characterizing the retimed digital data signal, and reflecting the increased-voltage, retimed digital data signal in the output stage input signals [21].

14. The resynchronizing drive circuit of claim 13, wherein the retiming flip-flop [33] is further configured to resynchronize the bitstream digital data signal [16] at the desired carrier frequency [11] using the master clock signal [15] to eliminate asymmetries arising from signal transmission over backplane conductors within a bitstream generator [14] utilized to frequency-translate the input baseband digital data signal [13] to the desired carrier frequency [11].

15. The resynchronizing drive circuit of claim 10, further comprising a feedback stabilizer [40] operative for stabilizing voltage swings in the output stage input signals [21].

16. The resynchronizing drive circuit of claim 15, wherein the feedback stabilizer [40] further comprises one or more feedback loops operative for regulating voltages in the output stage input signals [21] to produce consistent voltage swings irrespective of load resistor values.

17. The resynchronizing drive circuit of claim 10, further comprising a buffer [44] operative to supply desired power in the output stage input signals [21].

18. The resynchronizing drive circuit of claim 17, wherein the buffer [44] comprises one or more telescoped buffer chains.

19. A switching radio frequency power amplifier system [10+12], comprising:
a switching radio frequency power amplifier [12] comprising a pair of output transistors [26];
a bitstream generator [14] operative for encoding a baseband digital data signal [13] into an input baseband signal to generate an information-bearing input baseband signal and frequency-translating information-bearing input baseband signal to desired carrier frequency [11] to generate a bitstream digital data signal [16]; and
a gate driver circuit [20] comprising:
an input stage [30] operative for converting the bitstream digital data signal [16] into a pair of output stage input signals [21] encoding the digital data signal [13],
an output stage [32] operative for receiving the output stage input signals [21] and generating nominally complementary output pulse signals [17] at a pair of output gates [22, 24] encoding the digital data signal [13], and
wherein the output stage [32] comprises a pair of cascoded CMOS gate drivers [36a-b] connected in a push-pull configuration to gates of the output transistors [26] of the switching radio frequency power amplifier [12].

20. The switching radio frequency power amplifier system of claim 19, wherein the input stage [30] further comprises:
a low-jitter master clock oscillator [31] operative for generating a master clock signal [15] at a harmonic of the desired carrier frequency [11];
a retiming flip-flop [33] operative for receiving the master clock signal [15] from the master clock oscillator [31], receiving the bitstream digital data signal [16], and generating a retimed digital data signal [19] by modulating the bitstream digital data signal [16] with the master clock signal [15] to resynchronize the digital data signal [13] at the desired carrier frequency [11]; and
a level shift [34] operative for receiving the retimed digital data signal [19], increasing a voltage characterizing the retimed digital data signal, and reflecting the increased-voltage, retimed digital data signal in the output stage input signals [21].

21. The switching radio frequency power amplifier system of claim 19, wherein the switching radio frequency power amplifier [12] further comprises a bandpass filter [28] operative to recover the modulated digital data signal [13] encoded in the output of the output transistors [26] of the switching radio frequency power amplifier [12] and eliminate out-band quantization noise.

* * * * *